(12) United States Patent
Liu et al.

(10) Patent No.: US 9,634,278 B2
(45) Date of Patent: Apr. 25, 2017

(54) OLED PIXEL STRUCTURE

(71) Applicant: Shenzhen China Star Optoelectronics Technology Co., Ltd., Shenzhen, Guangdong (CN)

(72) Inventors: Yawei Liu, Guangdong (CN); Yifan Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 157 days.

(21) Appl. No.: 14/426,975

(22) PCT Filed: Aug. 14, 2014

(86) PCT No.: PCT/CN2014/084335
§ 371 (c)(1),
(2) Date: Mar. 9, 2015

(87) PCT Pub. No.: WO2016/004663
PCT Pub. Date: Jan. 14, 2016

(65) Prior Publication Data
US 2016/0248029 A1    Aug. 25, 2016

(30) Foreign Application Priority Data
Jul. 9, 2014    (CN) .......................... 2014 1 0326557

(51) Int. Cl.
*H01L 51/50*    (2006.01)
*C09K 11/56*    (2006.01)
(Continued)

(52) U.S. Cl.
CPC .......... *H01L 51/502* (2013.01); *C09K 11/565* (2013.01); *C09K 11/59* (2013.01);
(Continued)

(58) Field of Classification Search
CPC .............. H01L 51/502; H01L 27/3213; H01L 51/5088; H01L 51/5072; H01L 51/5221;
(Continued)

(56) References Cited

U.S. PATENT DOCUMENTS

2012/0228648 A1* 9/2012 Mitsuya .............. H01L 51/5044
257/88
2014/0374696 A1* 12/2014 Liu ........................ H01L 51/502
257/13

FOREIGN PATENT DOCUMENTS

CN            103346266 A    10/2013

* cited by examiner

*Primary Examiner* — Donald Raleigh
*Assistant Examiner* — Kevin Quarterman
(74) *Attorney, Agent, or Firm* — Andrew C. Cheng

(57) ABSTRACT

The present invention provides an OLED pixel structure, comprising: red, green and blue sub pixels, and the red sub pixel comprises a red light emitting layer, and the green sub pixel comprises a green light emitting layer, and the blue sub pixel comprises a blue light emitting layer, and material of the blue light emitting layer comprises inorganic quantum dots, and the blue light emitting layer emits white light, and a blue light filter is located corresponding to the blue sub pixel. By the blue sub pixel utilizing inorganic quantum dots+blue light filter, the stability and the life time of the OLED elements have been obviously promoted. The present invention further adds a white sub pixel, and the white sub pixel comprises a white light emitting layer, and material of the white light emitting layer comprises inorganic quantum dots. With the added white sub pixel, the luminous efficiency of the OLED is raised and the energy consumption thereof is reduced.

15 Claims, 8 Drawing Sheets

(51) Int. Cl.
C09K 11/59 (2006.01)
C09K 11/88 (2006.01)
H01L 27/32 (2006.01)
H01L 51/00 (2006.01)
H01L 51/52 (2006.01)
B82Y 20/00 (2011.01)
B82Y 40/00 (2011.01)
H01L 51/56 (2006.01)

(52) U.S. Cl.
CPC .......... *C09K 11/883* (2013.01); *H01L 27/322* (2013.01); *H01L 27/3211* (2013.01); *H01L 27/3213* (2013.01); *H01L 27/3248* (2013.01); *H01L 51/001* (2013.01); *H01L 51/5056* (2013.01); *H01L 51/5072* (2013.01); *H01L 51/5088* (2013.01); *H01L 51/5206* (2013.01); *H01L 51/5221* (2013.01); *B82Y 20/00* (2013.01); *B82Y 40/00* (2013.01); *H01L 51/0035* (2013.01); *H01L 51/0037* (2013.01); *H01L 51/0061* (2013.01); *H01L 51/0067* (2013.01); *H01L 51/0072* (2013.01); *H01L 51/0081* (2013.01); *H01L 51/0085* (2013.01); *H01L 51/56* (2013.01); *H01L 2227/323* (2013.01); *Y02B 20/181* (2013.01); *Y10S 977/774* (2013.01); *Y10S 977/824* (2013.01); *Y10S 977/893* (2013.01); *Y10S 977/952* (2013.01)

(58) Field of Classification Search
CPC ... H01L 51/56; H01L 51/001; H01L 27/3248; H01L 27/322; H01L 51/5056; H01L 51/5206; H01L 51/52; H01L 27/32; H01L 51/0085; H01L 2227/323; H01L 51/0067; H01L 51/0061; H01L 51/0037; H01L 51/0035; H01L 51/0072; H01L 51/0081; C09K 11/883; C09K 11/59; C09K 11/565; Y10S 977/952; Y10S 977/824; Y10S 977/774; Y10S 977/893; B82Y 40/00; B82Y 20/00
See application file for complete search history.

OLED PIXEL STRUCTURE

FIELD OF THE INVENTION

The present invention relates to an Organic Light Emitting Display manufacture field, and more particularly to an OLED pixel structure.

BACKGROUND OF THE INVENTION

A flat panel display possesses advantages of being ultra thin, power saved and radiation free. It has been widely utilized. A present flat panel display mainly comprises a LCD (Liquid Crystal Display) or an OLED (Organic Light Emitting Display).

An OLED possesses many outstanding properties of self-illumination, no requirement of backlight, high contrast, ultra-thin, wide view angle, fast response, applicability of flexible panel, wide range of working temperature, simpler structure and process. Therefore, the OLED is considered as next generation flat panel display technology. As considering the molecular weight of the organic electroluminescence material, the organic electroluminescence elements can be categorized as Organic Light Emitting Diode (OLED) and Polymer Light Emitting Diode (PLED). The molecular weights are different and the manufacture processes of the organic electroluminescence elements are significantly different. OLED is mainly manufactured by thermal deposition. PLED is manufactured by thermal deposition or inkjet printing.

Generally, OLED comprises a substrate, an ITO transparent anode located on the substrate, a Hole Injection Layer (HIL) located on the ITO transparent anode, a Hole Transporting Layer (HTL) located on the Hole Injection Layer, an Emitting Material Layer (EML) located on the Hole Transporting Layer, an Electron Transport Layer (ETL) located on the Emitting Material layer, an Electron Injection Layer (EIL) located on the Electron Transport Layer and a cathode located on the Electron Injection Layer. For promoting the efficiency, the emitting material layer is generally applied with co-host system.

Semiconductor nanocrystals (NCs) mean the semiconductor nanocrystal particles with size of 1-100 nm. Because the size of the semiconductor nanocrystals is smaller than the Exciton Bohr Radius of the material. Strong quantum confinement effect appears. The quasicontinuum evolves to become similar to the discrete energy level of the molecules and shows new material properties. Therefore, it is so called quantum dots (QDs). With the excitation of the external energy (photoluminescence, electroluminescence, cathode ray luminescence and etc.), the electrons jumps from the ground state to the excited state. The electrons and the electron holes in the excited state may form excitons. The electrons and the electron holes generate recombinations and ultimately relax to the ground state. The supernumerary energy may irradiate and generate photons with the processes of the recombination and relaxation.

The Quantum Dots Light Emitting Diodes (QD-LEDs) have significant commercial application values and cause strong research interests of the people in the recent decay. In fact, QD-LEDs possess many advantages in comparison with Organic Light Emitting Diodes (OLEDs): (1) The luminous line width of the quantum dots is between 20-30 nm. The FWHM is narrower compared with the luminescence of the organic electroluminescence >50 nm which functions as the key to achieve the great color purity of the image. (2) The inorganic material shows a better heat stability than that of the organic material. The Joule heat is the main reason to make the elements degenerated when the elements are under high brightness or high current density. With the excellent heat stability, the elements of inorganic material show longer usage time. (3) The color of the OLED display changes with time because the life times of the organic materials of three primary colors, red, green and blue. However, quantum dots are synthesized to have different size by one kind of material to realize the light emitting of the three primary colors. Similar degeneration life time can be obtained by using the same kind of material. (4) QD-LEDs is capable of realizing the light emitting of the red light and the wavelength of the organic material is generally smaller than 1 micrometer. (5) For the quantum dots, there is not restriction for the spin-statistics and the external quantum efficiency (EQE) is possible to reach up to 100%. The EQE of the QD-LEDs can be indicated as: $\eta_{Ext}=\eta_r*\eta_{INT}*\eta*\eta_{OUT}$. The $\eta_r$ is the probability that the electrons and the electron holes form the excitons. The $\eta_{INT}$ is the internal quantum efficiency, i.e. the photoluminescence quantum yield (PL QY). The $\eta$ is the probability of the radiative jump. The $\eta_{OUT}$ is the efficiency of the external coupling. The restriction of the organic fluorescent dye $\eta_r$ is 25%. The formation ratio of the single state and the triplet state is 1:3 and only the recombination of the single state excitons results in luminescence. Then, with the spin orbit coupling, the $\eta_r$ of the organic phosphorescent material can be larger than 25%. Significantly, the organic phosphorescent material causes the degeneration of the fertile material. The $\eta_{OUT}$ of the flat panel display is about 20% and the efficiency of the external coupling can be raised with the microcavity structure. For the QD-LEDs, the $\eta_{INT}$ can reach up to 100%. Meanwhile, the $\eta_r$ can reach up to 100% when the energy level of the electron and electron hole befit.

The Quantum Dots Light Emitting Diodes (QD-LEDs) can comprise organic inorganic hybrid elements and full inorganic elements. The former can realize high brightness and flexible applicability. The latter possess great advantage of element stability. There are two common development directions for the colorful OLED. One is RGB, three primary color luminescence. Samsung is the representative. The skill is merely applicable to the organic small molecular material which easily sublimates. The merit is that the art is simple, mature and easy for operation. Nevertheless, as manufacturing the high resolution display screens, high accuracy mask and precise alignment are required. Consequently, low productivity and high manufacture cost are the results. The other is white light+RGB filters skill. LG is the representative. The mature CF skill of LCD can be utilized without the mask alignment. The vapor deposition is tremendously simplified and the manufacture cost is possibly reduced which is applicable for manufacturing the large size, high resolution OLEDs. However, most of the luminous energy is absorbed by the filters and only 30% of the light can penetrate through. The high efficient white light material becomes essential. Otherwise, the element efficiency is lower and generally can be only applied for small molecule OLED display screens.

SUMMARY OF THE INVENTION

An objective of the present invention is to provide an OLED pixel structure that the stability and the life time of the OLED have been obviously promoted in comparison with the traditional OLEDs. Meanwhile, the luminous efficiency is raised and the energy consumption is reduced.

For realizing the aforesaid objective, the present invention provides an OLED pixel structure, comprising: red, green and blue sub pixels, and the red sub pixel comprises a red light emitting layer, and the green sub pixel comprises a green light emitting layer, and the blue sub pixel comprises a blue light emitting layer, and material of the blue light emitting layer comprises inorganic quantum dots, and the blue light emitting layer emits white light, and a blue light filter is located corresponding to the blue sub pixel.

The inorganic quantum dots are white light quantum dots, or the inorganic quantum dots are a combination of red light quantum dots, green light quantum dots and blue light quantum dots, or the inorganic quantum dots are a combination of blue light quantum dots and yellow light quantum dots.

The white light quantum dots are CdSe, CdS, CdTe, CdMnS, ZnSe or ZnMnSe II-VI compounds quantum dots, and the blue light quantum dots are ZnCdS, CdSe/ZnS or nano $SiN_4$, and the green light quantum dots are CdSe/ZnS, or ZnSe:$Cu^{2+}$, and the red light quantum dots are CdSe/CdS/ZnS, and the yellow light quantum dots are CdSe/CdS/ZnS or ZnS:$Mn^{2+}$.

A manufacture process of the blue light emitting layer is: mixing inorganic quantum dots particles and surface covering with solvent, and coating, volatilizing and removing the solvent to obtain the inorganic quantum dots, and the surface covering comprises stearic acid, trioctylphosphine oxide or polymethylmethacrylate; the solvent is chloroform, methylbenzene, chlorobenzene or methanol.

A manufacture process of the blue light emitting layer is: mixing organic main material, and inorganic quantum dots particles with solvent, and coating, volatilizing and removing the solvent to obtain the inorganic quantum dots; the organic main material is TCTA or TRZ; the solvent is chloroform, methylbenzene, chlorobenzene or methanol.

The red light emitting layer is formed by red light organic light emitting material which is Ir(piq)$_3$, and the green light emitting layer is formed by green light organic light emitting material which is Ir(ppy)$_3$.

The OLED pixel structure further comprises a substrate and a covering layer tight fitting on the substrate, and the red, green and blue sub pixels are respectively located on the substrate and covered by the covering layer, and material of the substrate and the covering layer is glass or flexible material, and at least one of the substrate and the covering layer is pervious to light; the blue light filter is correspondingly located under the covering layer of the corresponding blue sub pixel.

The red sub pixel comprises: an anode on the substrate, a thin film transistor on the anode, a Hole Injection Layer on the thin film transistor, a Hole Transporting Layer on the Hole Injection Layer, a red light emitting layer on the Hole Transporting Layer, an Electron Transport Layer on the red light emitting layer and a cathode on the Electron Transport Layer; the green sub pixel comprises: an anode on the substrate, a thin film transistor on the anode, a Hole Injection Layer on the thin film transistor, a Hole Transporting Layer on the Hole Injection Layer, a green light emitting layer on the Hole Transporting Layer, an Electron Transport Layer on the green light emitting layer and a cathode on the Electron Transport Layer; the blue sub pixel comprises: an anode on the substrate, a thin film transistor on the anode, a Hole Injection Layer on the thin film transistor, a Hole Transporting Layer on the Hole Injection Layer, a blue light emitting layer on the Hole Transporting Layer, an Electron Transport Layer on the blue light emitting layer and a cathode on the Electron Transport Layer; material of the Electron Transport Layer is 8-Hydroxyquinoline aluminum, and material of the Hole Transporting Layer is polytriphenylamine, and material of the Hole Injection Layer is PEDOT.

The red light emitting layer and the green light emitting layer are manufacture by vacuum evaporation and formed after the blue light emitting layer is formed.

The OLED pixel structure further comprises a white light sub pixel, and the white light sub pixel comprises a white light emitting layer, and material of the white light emitting layer comprises inorganic quantum dots, and the white light emitting layer emits white light.

The white light emitting layer and the blue light emitting layer are manufacture by the same process with the same material.

The OLED pixel structure further comprises a substrate and a covering layer tight fitting on the substrate, and the red, green, blue and white sub pixels are respectively located on the substrate and covered by the covering layer, and material of the substrate and the covering layer is glass or flexible material, and at least one of the substrate and the covering layer is pervious to light; the blue light filter is correspondingly located under the covering layer of the corresponding blue sub pixel.

The red sub pixel comprises: an anode on the substrate, a thin film transistor on the anode, a Hole Injection Layer on the thin film transistor, a Hole Transporting Layer on the Hole Injection Layer, a red light emitting layer on the Hole Transporting Layer, an Electron Transport Layer on the red light emitting layer and a cathode on the Electron Transport Layer; the green sub pixel comprises: an anode on the substrate, a thin film transistor on the anode, a Hole Injection Layer on the thin film transistor, a Hole Transporting Layer on the Hole Injection Layer, a green light emitting layer on the Hole Transporting Layer, an Electron Transport Layer on the green light emitting layer and a cathode on the Electron Transport Layer; the blue sub pixel comprises: an anode on the substrate, a thin film transistor on the anode, a Hole Injection Layer on the thin film transistor, a Hole Transporting Layer on the Hole Injection Layer, a blue light emitting layer on the Hole Transporting Layer, an Electron Transport Layer on the blue light emitting layer and a cathode on the Electron Transport Layer; the white sub pixel comprises: an anode on the substrate, a thin film transistor on the anode, a Hole Injection Layer on the thin film transistor, a Hole Transporting Layer on the Hole Injection Layer, a white light emitting layer on the Hole Transporting Layer, an Electron Transport Layer on the white light emitting layer and a cathode on the Electron Transport Layer; material of the Electron Transport Layer is 8-Hydroxyquinoline aluminum, and material of the Hole Transporting Layer is polytriphenylamine, and material of the Hole Injection Layer is PEDOT.

The red light emitting layer and the green light emitting layer are manufacture by vacuum evaporation and formed after the blue light emitting layer and the white light emitting layer are formed.

The present invention further provides an OLED pixel structure, comprising: red, green and blue sub pixels, and the red sub pixel comprises a red light emitting layer, and the green sub pixel comprises a green light emitting layer, and the blue sub pixel comprises a blue light emitting layer, and material of the blue light emitting layer comprises inorganic quantum dots, and the blue light emitting layer emits white light, and a blue light filter is located corresponding to the blue sub pixel;

wherein the inorganic quantum dots are white light quantum dots, or the inorganic quantum dots are a combination of red light quantum dots, green light quantum dots and blue light quantum dots, or the inorganic quantum dots are a combination of blue light quantum dots and yellow light quantum dots;

wherein the white light quantum dots are CdSe, CdS, CdTe, CdMnS, ZnSe or ZnMnSe II-VI compounds quantum dots, and the blue light quantum dots are ZnCdS, CdSe/ZnS or nano $SiN_4$, and the green light quantum dots are CdSe/ZnS, or $ZnSe:Cu^{2+}$, and the red light quantum dots are CdSe/CdS/ZnS, and the yellow light quantum dots are CdSe/CdS/ZnS or $ZnS:Mn^{2+}$;

wherein a manufacture process of the blue light emitting layer is: mixing inorganic quantum dots particles and surface covering with solvent, and coating, volatilizing and removing the solvent to obtain the inorganic quantum dots, and the surface covering comprises stearic acid, trioctylphosphine oxide or polymethylmethacrylate; the solvent is chloroform, methylbenzene, chlorobenzene or methanol;

wherein a manufacture process of the blue light emitting layer is: mixing organic main material, and inorganic quantum dots particles with solvent, and coating, volatilizing and removing the solvent to obtain the inorganic quantum dots; the organic main material is TCTA or TRZ; the solvent is chloroform, methylbenzene, chlorobenzene or methanol;

wherein the red light emitting layer is formed by red light organic light emitting material which is $Ir(piq)_3$, and the green light emitting layer is formed by green light organic light emitting material which is Ir(ppy)3;

the OLED pixel structure further comprises a substrate and a covering layer tight fitting on the substrate, and the red, green and blue sub pixels are respectively located on the substrate and covered by the covering layer, and material of the substrate and the covering layer is glass or flexible material, and at least one of the substrate and the covering layer is pervious to light; the blue light filter is correspondingly located under the covering layer of the corresponding blue sub pixel;

wherein the red sub pixel comprises: an anode on the substrate, a thin film transistor on the anode, a Hole Injection Layer on the thin film transistor, a Hole Transporting Layer on the Hole Injection Layer, a red light emitting layer on the Hole Transporting Layer, an Electron Transport Layer on the red light emitting layer and a cathode on the Electron Transport Layer; the green sub pixel comprises: an anode on the substrate, a thin film transistor on the anode, a Hole Injection Layer on the thin film transistor, a Hole Transporting Layer on the Hole Injection Layer, a green light emitting layer on the Hole Transporting Layer, an Electron Transport Layer on the green light emitting layer and a cathode on the Electron Transport Layer; the blue sub pixel comprises: an anode on the substrate, a thin film transistor on the anode, a Hole Injection Layer on the thin film transistor, a Hole Transporting Layer on the Hole Injection Layer, a blue light emitting layer on the Hole Transporting Layer, an Electron Transport Layer on the blue light emitting layer and a cathode on the Electron Transport Layer; material of the Electron Transport Layer is 8-Hydroxyquinoline aluminum, and material of the Hole Transporting Layer is polytriphenylamine, and material of the Hole Injection Layer is PEDOT;

wherein the red light emitting layer and the green light emitting layer are manufacture by vacuum evaporation and formed after the blue light emitting layer is formed.

The benefits of the present invention are: in the OLED pixel structure of the present invention, by the blue sub pixel utilizing inorganic quantum dots+blue light filter, the stability and the life time of the OLED elements have been obviously promoted. With the added white sub pixel, the luminous efficiency of the OLED is raised and the energy consumption thereof is reduced.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

The technical solution, as well as beneficial advantages, of the present invention will be apparent from the following detailed description of an embodiment of the present invention, with reference to the attached drawings.

Figure 1:
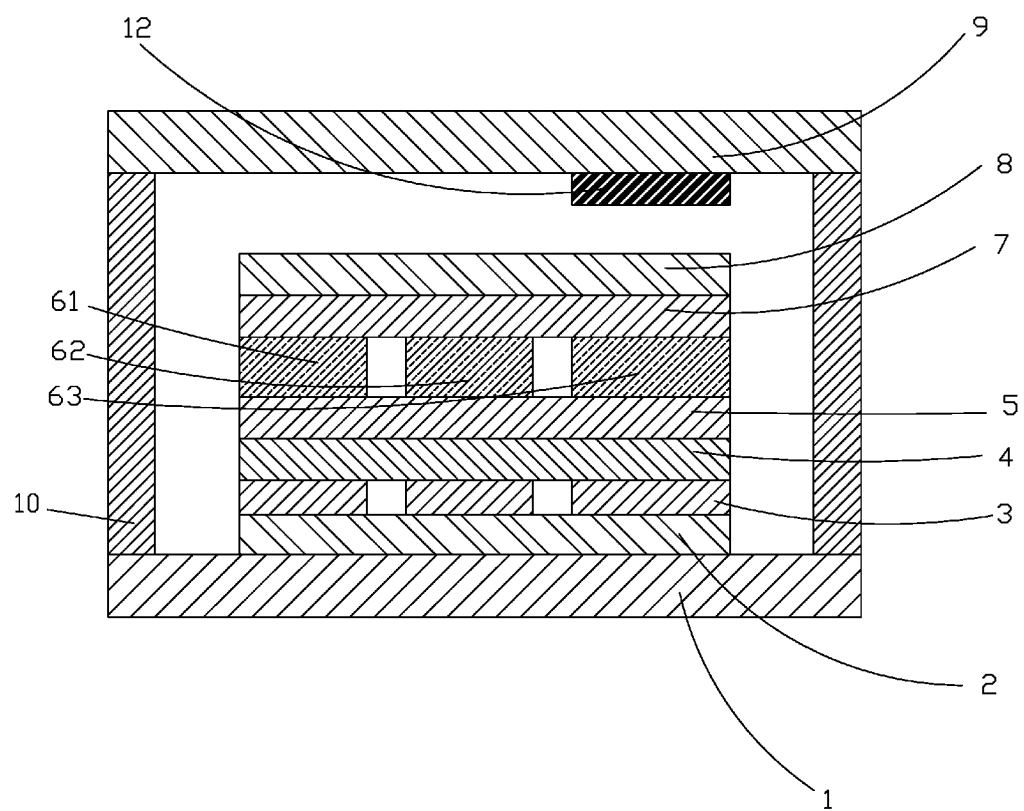
FIG. 1 is a structural diagram of an OLED pixel structure according to the first embodiment of the present invention.
Figure 2:
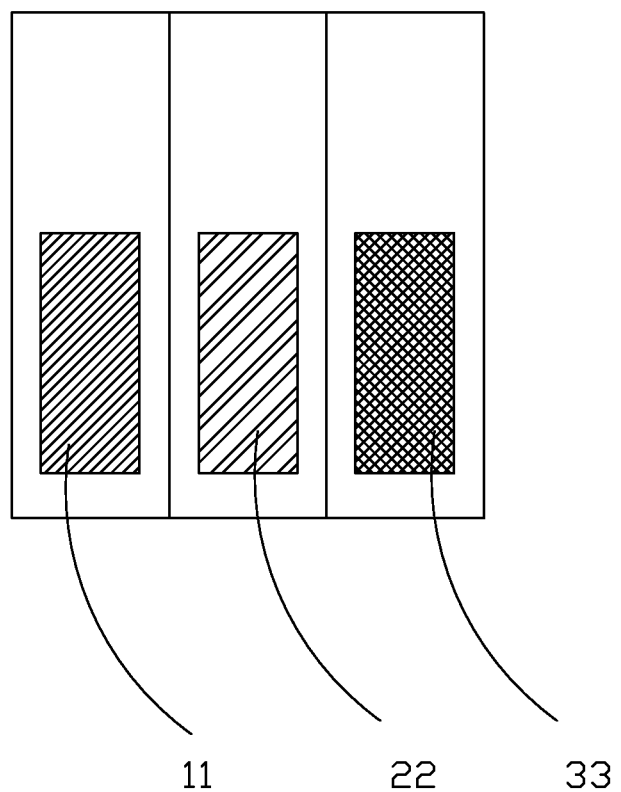
FIG. 2 is a plain view diagram of an OLED pixel structure according to the first embodiment of the present invention.

Please refer to FIGS. 1-2 which are the first embodiment of the present invention. In this embodiment, the present invention provides an OLED pixel structure, comprising red, green and blue sub pixels 11, 22, 33, and the red sub pixel 11 comprises a red light emitting layer 61, and the green sub pixel 22 comprises a green light emitting layer 62, and the blue sub pixel 33 comprises a blue light emitting layer 63, and material of the blue light emitting layer 63 comprises inorganic quantum dots, and the blue light emitting layer 63 emits white light, and a blue light filter 12 is located corresponding to the blue sub pixel 33.

The inorganic quantum dots are white light quantum dots, or the inorganic quantum dots are a combination of red light quantum dots, green light quantum dots and blue light quantum dots, or the inorganic quantum dots are a combination of blue light quantum dots and yellow light quantum dots or other possible combinations.

The white light quantum dots are CdSe, CdS, CdTe, CdMnS, ZnSe or ZnMnSe II-VI compounds quantum dots, and the blue light quantum dots are ZnCdS, CdSe/ZnS or nano $SiN_4$, and the green light quantum dots are CdSe/ZnS, or $ZnSe:Cu^{2+}$, and the red light quantum dots are CdSe/CdS/ZnS, and the yellow light quantum dots are CdSe/CdS/ZnS or $ZnS:Mn^{2+}$.

A manufacture process of the blue light emitting layer 63 is: mixing inorganic quantum dots particles and surface covering with solvent, and coating, volatilizing and removing the solvent to obtain the inorganic quantum dots, and the surface covering comprises stearic acid, trioctylphosphine oxide or polymethylmethacrylate; the solvent can be chloroform, methylbenzene, chlorobenzene or methanol.

The manufacture process of the blue light emitting layer 63 also can be: mixing organic main material, and inorganic quantum dots particles with solvent, and coating, volatilizing and removing the solvent to obtain the inorganic quantum dots; the organic main material is TCTA or TRZ; the solvent can be chloroform, methylbenzene, chlorobenzene or methanol.

The organic main material is TCTA (4,4',4"-Tris(carbazol-9-yl)-triphenylamine) or TRZ (2,4,6-Tri(9H-carbazol-9-yl)-1,3,5-triazine).

The structure of the compound TCTA is:

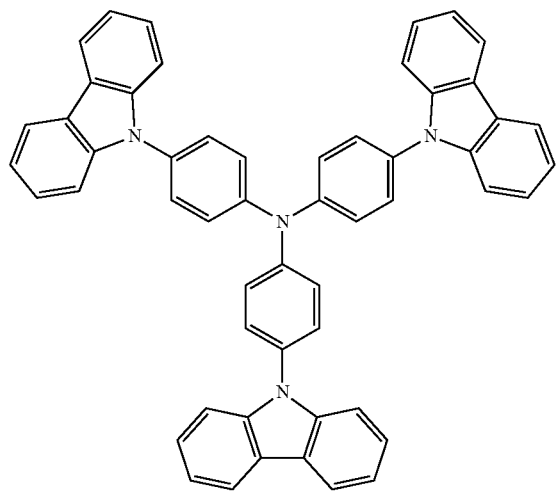 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

The structure of the compound TRZ is:

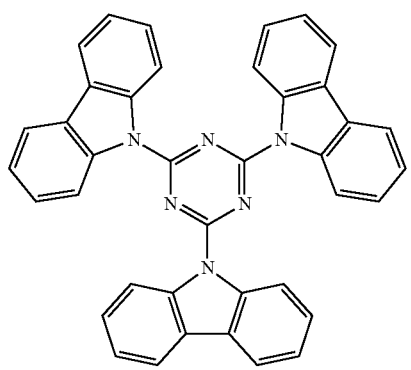 [SMILES: c1ccc2c(c1)c1ccccc1n2-c1nc(-n2c3ccccc3c3ccccc32)nc(-n2c3ccccc3c3ccccc32)n1]

Both the organic main material and the surface covering have one function, i.e. to prevent the agglomeration and oxidation of the inorganic quantum dots. Because the inorganic quantum dots are nanoparticles, zero dimension material which the surfactivity is large. The agglomeration easily happens to lead to oxidation and fluorescence quenching.

The red light emitting layer 61 is formed by red light organic light emitting material. The red light organic light emitting material is $Ir(piq)_3$, and the green light emitting layer 62 is formed by green light organic light emitting material. The green light organic light emitting material is $Ir(ppy)_3$.

The structure of the $Ir(piq)_3$ is:

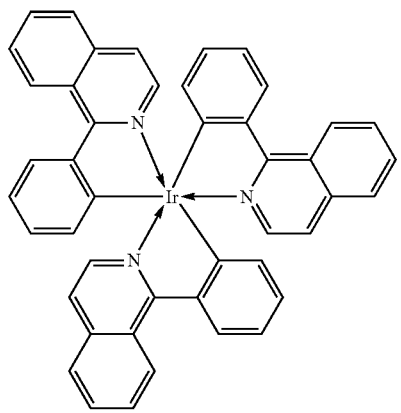

The structure of the $Ir(ppy)_3$ is:

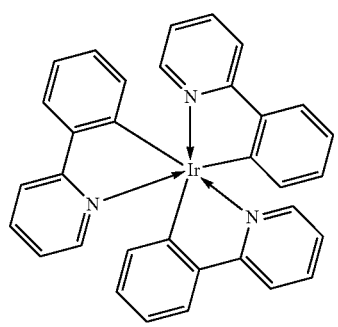

The red light emitting layer (61) and the green light emitting layer (62) are manufacture by vacuum evaporation and formed after the blue light emitting layer (63) is formed.

As aforementioned, the red sub pixel 11 and the green sub pixel 22 utilize organic material to self-illuminate. The blue sub pixel 33 illuminates white light. After being filtered with the corresponding blue light filter 12, the blue light is emitted.

The OLED pixel structure further comprises a substrate 1 and a covering layer 9 tight fitting on the substrate 1, and the red, green and blue sub pixels 11, 22, 33 are respectively located on the substrate 1 and covered by the covering layer 9, and material of the substrate 1 and the covering layer 9 is glass or flexible material, and at least one of the substrate 1 and the covering layer 9 is pervious to light; the blue light filter 12 is correspondingly located under the covering layer 9 of the corresponding blue sub pixel 33. The blue light filter 12 can employ the blue light filter utilized in production line of the present liquid crystal panels.

The red sub pixel 11 comprises: an anode 2 on the substrate 1, a thin film transistor 3 on the anode 2, a Hole Injection Layer 4 on the thin film transistor 3, a Hole Transporting Layer 5 on the Hole Injection Layer 4, a red light emitting layer 61 on the Hole Transporting Layer 5, an Electron Transport Layer 7 on the red light emitting layer 61 and a cathode 8 on the Electron Transport Layer 7; the green sub pixel 22 comprises: an anode 2 on the substrate 1, a thin film transistor 3 on the anode 2, a Hole Injection Layer 4 on the thin film transistor 3, a Hole Transporting Layer 5 on the Hole Injection Layer 4, a green light emitting layer 62 on the Hole Transporting Layer 5, an Electron Transport Layer 7 on the green light emitting layer 62 and a cathode 8 on the Electron Transport Layer 7; the blue sub pixel comprises: an anode 2 on the substrate 1, a thin film transistor 3 on the anode, a Hole Injection Layer 4 on the thin film transistor 3, a Hole Transporting Layer 5 on the Hole Injection Layer 4, a blue light emitting layer 63 on the Hole Transporting Layer 5, an Electron Transport Layer 7 on the blue light emitting layer 63 and a cathode 8 on the Electron Transport Layer 7.

The material of the Electron Transport Layer 7 is 8-Hydroxyquinoline aluminum, and the material of the Hole Transporting Layer 5 is polytriphenylamine, and the material of the Hole Injection Layer 4 is PEDOT (polyethylene dioxythiophene).

The substrate 1 and the covering layer 9 are cohered together with sealant 10 to seal and protect the electronic components inside.

Figure 3:
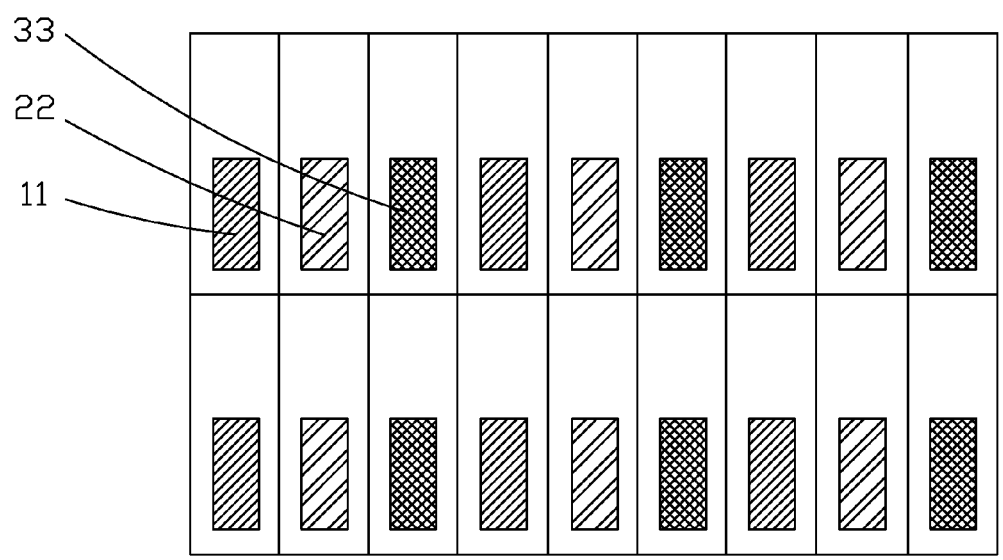
FIG. 3 is a diagram of the OLED pixel structure in FIG. 2 employed in a display panel.
Figure 4:
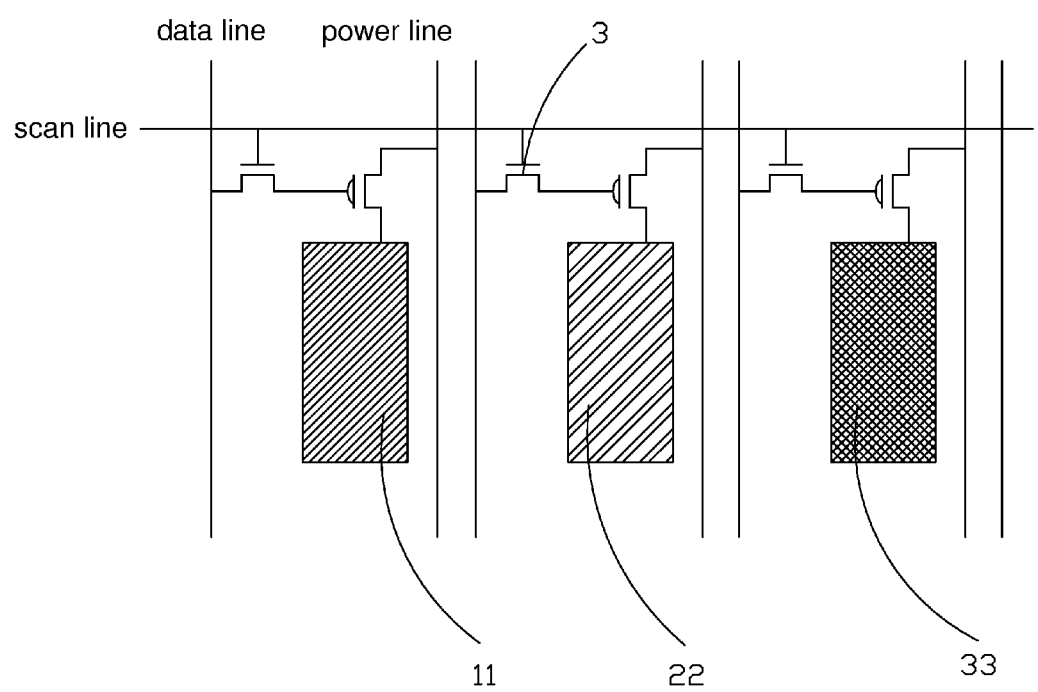
FIG. 4 is a structural diagram of a TFT driving circuit having the OLED pixel structure in FIG. 2.

Please refer to FIG. 2 and FIG. 3, which show an OLED pixel structure according to the first embodiment of the present invention utilized in a display panel. As shown in FIG. 4, the red sub pixel 11, the green sub pixel 22 and the blue sub pixel 33 are respectively driven by the TFT transistors 3.

Figure 5:
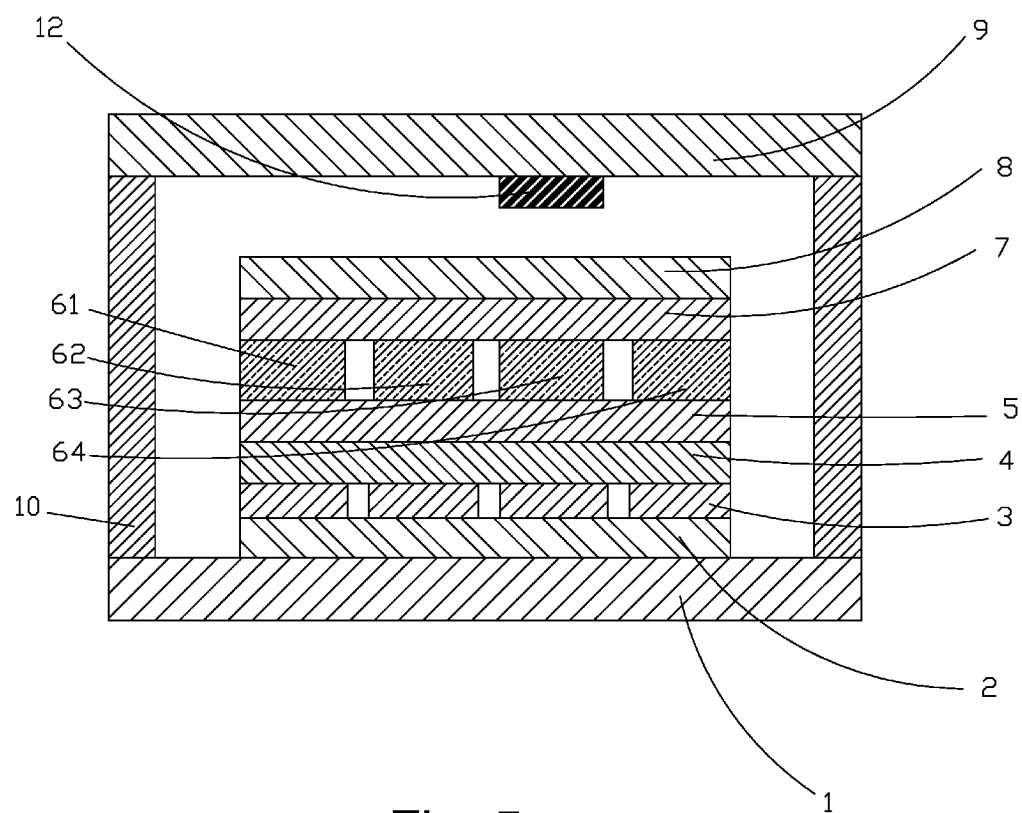
FIG. 5 is a structural diagram of an OLED pixel structure according to the second embodiment of the present invention.

Please refer to FIG. 5, which show the second embodiment of the present invention. Compared with the first embodiment of the present invention, the difference are that the pixel structure further comprises a white sub pixel 44, and the white light sub pixel 44 comprises a white light emitting layer 64, and material of the white light emitting layer 64 comprises inorganic quantum dots, and the white light emitting layer 64 emits white light.

The white light emitting layer 64 and the blue light emitting layer 63 are manufacture by the same process with the same material.

The white sub pixel 44 are located on the substrate 1 as well as the red, green and blue sub pixels 11, 22, 33 do and covered by the covering layer 9; the white sub pixel comprises: an anode 2 on the substrate 1, a thin film transistor 3 on the anode 2, a Hole Injection Layer 4 on the thin film transistor 3, a Hole Transporting Layer 5 on the Hole Injection Layer 4, a white light emitting layer 64 on the Hole Transporting Layer 5, an Electron Transport Layer 7 on the white light emitting layer 64 and a cathode 8 on the Electron Transport Layer 7.

Figure 6:
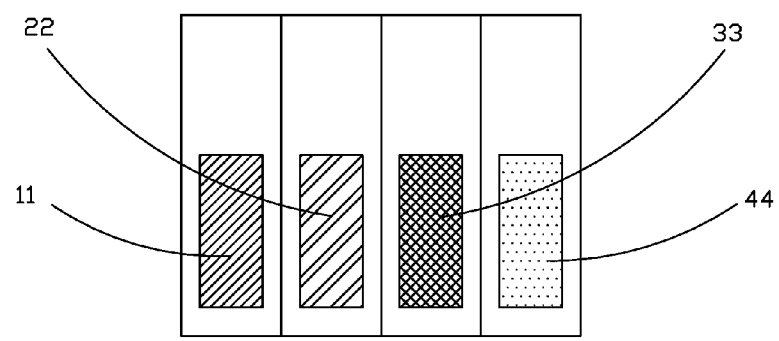
FIG. 6 is a plain view diagram of an OLED pixel structure according to the second embodiment of the present invention.
Figure 7:
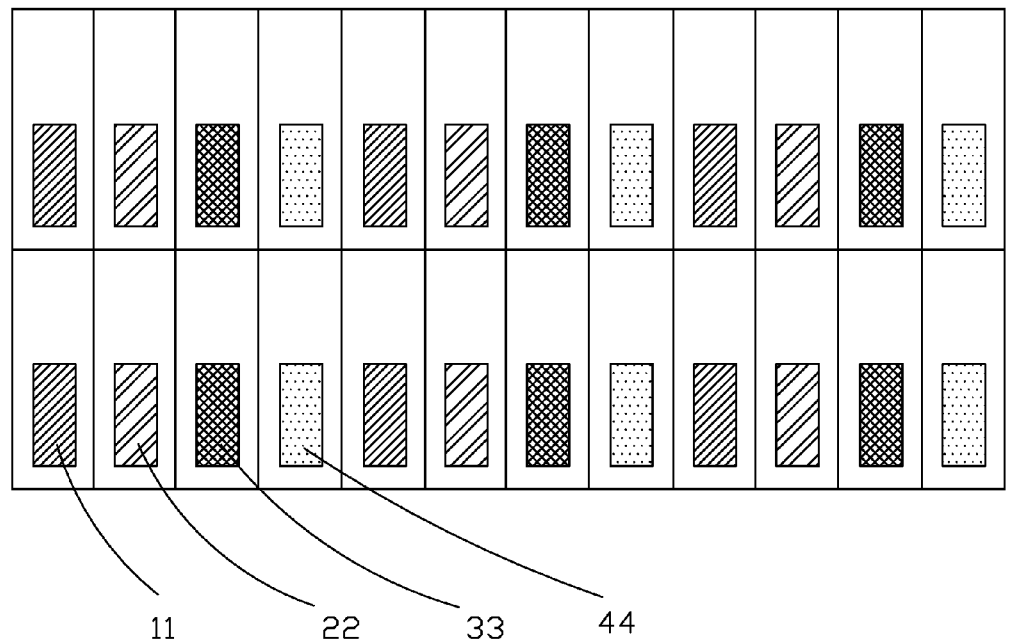
FIG. 7 is a diagram of the OLED pixel structure in FIG. 6 employed in a display panel.
Figure 8:
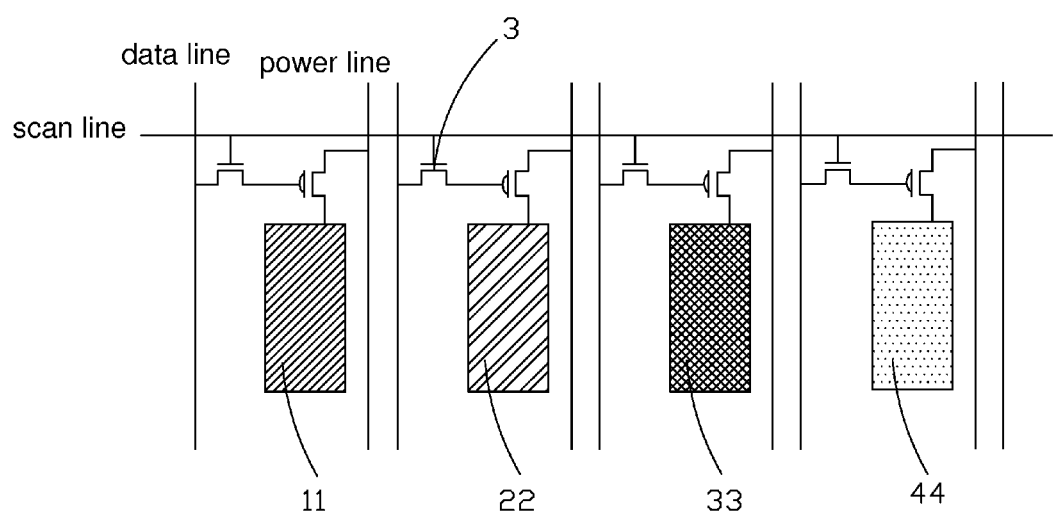
FIG. 8 is a structural diagram of a TFT driving circuit having the OLED pixel structure in FIG. 6.

Please refer to FIG. 6 and FIG. 7, which show an OLED pixel structure according to the second embodiment of the present invention utilized in a display panel. As shown in FIG. 8, the red sub pixel 11, the green sub pixel 22, the blue sub pixel 33 and the white sub pixel 44 are respectively driven by the TFT transistors 3.

Figure 9:
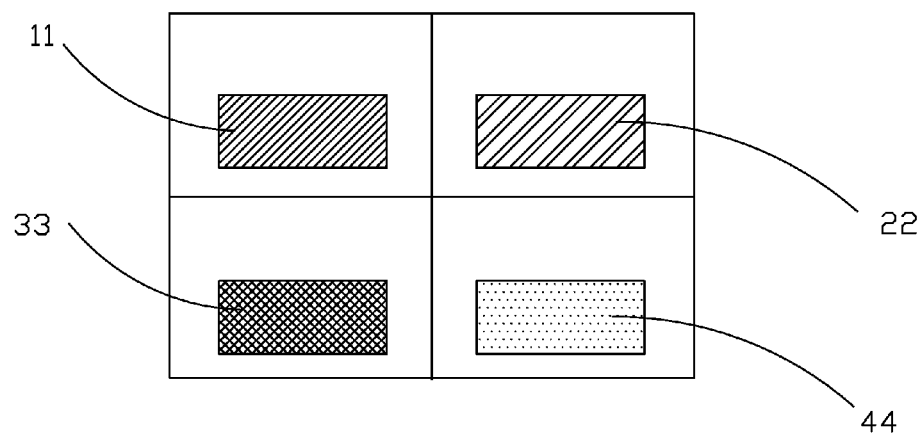
FIG. 9 is a structural diagram of an OLED pixel structure according to the third embodiment of the present invention.
Figure 10:
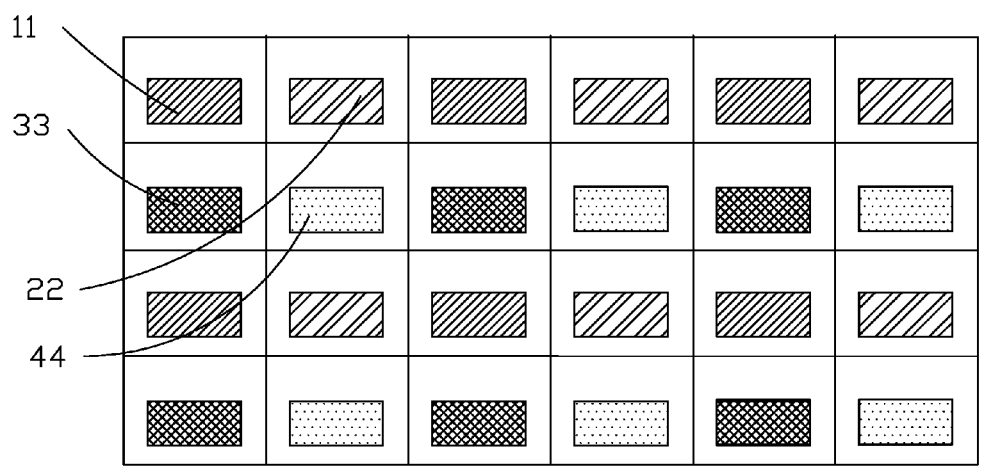
FIG. 10 is a plain view diagram of an OLED pixel structure according to the third embodiment of the present invention.

Please refer to FIG. 9 which is the third embodiment of the present invention. The differences from the second embodiment are that the red sub pixel 11, the green sub pixel 22, the blue sub pixel 33 and the white sub pixel 44 are arranged in two lines. Please refer to FIG. 10 which shows an OLED pixel structure according to the third embodiment of the present invention utilized in a display panel.

In conclusion, in the OLED pixel structure of the present invention, by the blue sub pixel utilizing inorganic quantum dots+blue light filter, the stability and the life time of the OLED elements have been obviously promoted. With the added white sub pixel, the luminous efficiency of the OLED is raised and the energy consumption thereof is reduced.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED pixel structure, comprising: red, green and blue sub pixels, and the red sub pixel comprises a red light emitting layer, and the green sub pixel comprises a green light emitting layer, and the blue sub pixel comprises a blue light emitting layer, and material of the blue light emitting layer comprises inorganic quantum dots, and the blue light emitting layer also emits white light, and a blue light filter is located corresponding to the blue sub pixel.

2. The OLED pixel structure according to claim 1, wherein the inorganic quantum dots are white light quantum dots, or the inorganic quantum dots are a combination of red light quantum dots, green light quantum dots and blue light quantum dots, or the inorganic quantum dots are a combination of blue light quantum dots and yellow light quantum dots.

3. The OLED pixel structure according to claim 2, wherein the white light quantum dots are CdSe, CdS, CdTe, CdMnS, ZnSe or ZnMnSe II-VI compounds quantum dots, and the blue light quantum dots are ZnCdS, CdSe/ZnS or nano $SiN_4$, and the green light quantum dots are CdSe/ZnS, or $ZnSe:Cu^{2+}$, and the red light quantum dots are CdSe/CdS/ZnS, and the yellow light quantum dots are CdSe/CdS/ZnS or $ZnS:Mn^{2+}$.

4. The OLED pixel structure according to claim 1, wherein a manufacture process of the blue light emitting layer is: mixing inorganic quantum dots particles and surface covering with solvent, and coating, volatilizing and removing the solvent to obtain the inorganic quantum dots, and the surface covering comprises stearic acid, trioctylphosphine oxide or polymethylmethacrylate; the solvent is chloroform, methylbenzene, chlorobenzene or methanol.

5. The OLED pixel structure according to claim 1, wherein a manufacture process of the blue light emitting layer is: mixing organic main material, and inorganic quantum dots particles with solvent, and coating, volatilizing and removing the solvent to obtain the inorganic quantum dots; the organic main material is TCTA or TRZ; the solvent is chloroform, methylbenzene, chlorobenzene or methanol.

6. The OLED pixel structure according to claim 1, wherein the red light emitting layer is formed by red light organic light emitting material which is $Ir(piq)_3$, and the green light emitting layer is formed by green light organic light emitting material which is $Ir(ppy)_3$.

7. The OLED pixel structure according to claim 1, further comprising a substrate and a covering layer tight fitting on the substrate, and the red, green and blue sub pixels are respectively located on the substrate and covered by the covering layer, and material of the substrate and the covering layer is glass or flexible material, and at least one of the substrate and the covering layer is pervious to light; the blue light filter is correspondingly located under the covering layer of the corresponding blue sub pixel.

8. The OLED pixel structure according to claim 7, wherein the red sub pixel comprises: a red-sub-pixel anode on the substrate, a red-sub-pixel thin film transistor on the red-sub-pixel anode, a red-sub-pixel Hole Injection Layer on the red-sub-pixel thin film transistor, a red-sub-pixel Hole Transporting Layer on the red-sub-pixel Hole Injection Layer, a red light emitting layer on the red-sub-pixel Hole Transporting Layer, a red-sub-pixel Electron Transport Layer on the red light emitting layer and a red-sub-pixel cathode on the red-sub-pixel Electron Transport Layer; the green sub pixel comprises: a green-sub-pixel anode on the substrate, a green-sub-pixel thin film transistor on the anode, a green-sub-pixel Hole Injection Layer on the green-sub-pixel thin film transistor, a green-sub-pixel Hole Transporting Layer on the green-sub-pixel Hole Injection Layer, a green light emitting layer on the green-sub-pixel Hole Transporting Layer, a green-sub-pixel Electron Transport Layer on the green light emitting layer and a green-sub-pixel cathode on the green-sub-pixel Electron Transport Layer; the blue sub pixel comprises: a blue-sub-pixel anode on the substrate, a blue-sub-pixel thin film transistor on the blue-sub-pixel anode, a blue-sub-pixel Hole Injection Layer on the blue-sub-pixel thin film transistor, a blue-sub-pixel Hole Transporting Layer on the blue-sub-pixel Hole Injection Layer, a blue light emitting layer on the blue-sub-pixel Hole Transporting Layer, a blue-sub-pixel Electron Transport Layer on the blue light emitting layer and a blue-sub-pixel cathode on the blue-sub-pixel Electron Transport Layer; a material of the red-sub-pixel, the green-sub-pixel, and the blue sub-pixel Electron Transport Layers is 8-Hydroxyquinoline aluminum, and a material of the red-sub-pixel, the green-sub-pixel, and the blue sub-pixel Hole Transporting layers is polytriphenylamine, and a material of the red-sub-pixel, the green-sub-pixel, and the blue sub-pixel Hole Injection Layers is PEDOT.

9. The OLED pixel structure according to claim 1, wherein the red light emitting layer and the green light emitting layer are manufacture by vacuum evaporation and formed after the blue light emitting layer is formed.

10. The OLED pixel structure according to claim 1, further comprising a white light sub pixel, and the white light sub pixel comprises a white light emitting layer, and material of the white light emitting layer comprises inorganic quantum dots, and the white light emitting layer emits white light.

11. The OLED pixel structure according to claim 10, wherein the white light emitting layer and the blue light emitting layer are manufacture by the same process with the same material.

12. The OLED pixel structure according to claim 10, further comprising a substrate and a covering layer tight fitting on the substrate, and the red, green, blue and white sub pixels are respectively located on the substrate and covered by the covering layer, and material of the substrate and the covering layer is glass or flexible material, and at least one of the substrate and the covering layer is pervious to light; the blue light filter is correspondingly located under the covering layer of the corresponding blue sub pixel.

13. The OLED pixel structure according to claim 12, wherein the red sub pixel comprises: a red-sub-pixel anode on the substrate, a red-sub-pixel thin film transistor on the red-sub-pixel anode, a red-sub-pixel Hole Injection Layer on the red-sub-pixel thin film transistor, a red-sub-pixel Hole Transporting Layer on the red-sub-pixel Hole Injection Layer, a red light emitting layer on the red-sub-pixel Hole Transporting Layer, a red-sub-pixel Electron Transport Layer on the red light emitting layer and a red-sub-pixel cathode on the red-sub-pixel Electron Transport Layer; the green sub pixel comprises: a green-sub-pixel anode on the substrate, a green-sub-pixel thin film transistor on the anode, a green-sub-pixel Hole Injection Layer on the green-sub-pixel thin film transistor, a green-sub-pixel Hole Transporting Layer on the green-sub-pixel Hole Injection Layer, a green light emitting layer on the green-sub-pixel Hole Transporting Layer, a green-sub-pixel Electron Transport Layer on the green light emitting layer and a green-sub-pixel cathode on the green-sub-pixel Electron Transport Layer; the blue sub pixel comprises: a blue-sub-pixel anode on the substrate, a blue-sub-pixel thin film transistor on the blue-sub-pixel anode, a blue-sub-pixel Hole Injection Layer on the blue-sub-pixel thin film transistor, a blue-sub-pixel Hole Transporting Layer on the blue-sub-pixel Hole Injection Layer, a blue light emitting layer on the blue-sub-pixel Hole Transporting Layer, a blue-sub-pixel Electron Transport Layer on the blue light emitting layer and a blue-sub-pixel cathode on the blue-sub-pixel Electron Transport Layer; the white sub pixel comprises: white-sub-pixel anode on the substrate, a white-sub-pixel thin film transistor on the white-sub-pixel anode, a white-sub-pixel Hole Injection Layer on the white-sub-pixel thin film transistor, a white-sub-pixel Hole Transporting Layer on the white-sub-pixel Hole Injection Layer, a white light emitting layer on the white-sub-pixel Hole Transporting Layer, a white-sub-pixel Electron Transport Layer on the white light emitting layer and a white-sub-pixel cathode on the white-sub-pixel Electron Transport Layer; a material of the red-sub-pixel, green-sub-pixel, blue-sub-pixel, and white-sub-pixel Electron Transport Layers is 8-Hydroxyquinoline aluminum, and a material of the red-sub-pixel, green-sub-pixel, blue-sub-pixel, and white-sub-pixel Hole Transporting Layers is polytriphenylamine, and a material of the red-sub-pixel, green-sub-pixel, blue-sub-pixel, and white-sub-pixel Hole Injection Layers is PEDOT.

14. The OLED pixel structure according to claim 10, wherein the red light emitting layer and the green light emitting layer are manufacture by vacuum evaporation and formed after the blue light emitting layer and the white light emitting layer are formed.

15. An OLED pixel structure, comprising: red, green and blue sub pixels, and the red sub pixel comprises a red light emitting layer, and the green sub pixel comprises a green light emitting layer, and the blue sub pixel comprises a blue light emitting layer, and material of the blue light emitting layer comprises inorganic quantum dots, and the blue light emitting layer also emits white light, and a blue light filter is located corresponding to the blue sub pixel;
wherein the inorganic quantum dots are white light quantum dots, or the inorganic quantum dots are a combination of red light quantum dots, green light quantum dots and blue light quantum dots, or the inorganic quantum dots are a combination of blue light quantum dots and yellow light quantum dots;
wherein the white light quantum dots are CdSe, CdS, CdTe, CdMnS, ZnSe or ZnMnSe II-VI compounds quantum dots, and the blue light quantum dots are ZnCdS, CdSe/ZnS or nano $SiN_4$, and the green light quantum dots are CdSe/ZnS, or $ZnSe:Cu^{2+}$, and the red light quantum dots are CdSe/CdS/ZnS, and the yellow light quantum dots are CdSe/CdS/ZnS or $ZnS:Mn^{2+}$;
wherein a manufacture process of the blue light emitting layer is: mixing inorganic quantum dots particles and surface covering with solvent, and coating, volatilizing and removing the solvent to obtain the inorganic quantum dots, and the surface covering comprises stearic acid, trioctylphosphine oxide or polymethylmethacrylate; the solvent is chloroform, methylbenzene, chlorobenzene or methanol;
wherein a manufacture process of the blue light emitting layer is: mixing organic main material, and inorganic quantum dots particles with solvent, and coating, volatilizing and removing the solvent to obtain the inorganic quantum dots; the organic main material is TCTA or TRZ; the solvent is chloroform, methylbenzene, chlorobenzene or methanol;

wherein the red light emitting layer is formed by red light organic light emitting material which is $Ir(piq)_3$, and the green light emitting layer is formed by green light organic light emitting material which is Ir(ppy)3;

wherein the OLED pixel structure further comprises a substrate and a covering layer tight fitting on the substrate, and the red, green and blue sub pixels are respectively located on the substrate and covered by the covering layer, and material of the substrate and the covering layer is glass or flexible material, and at least one of the substrate and the covering layer is pervious to light; the blue light filter is correspondingly located under the covering layer of the corresponding blue sub pixel;

wherein the red sub pixel comprises: a red-sub-pixel anode on the substrate, a red-sub-pixel thin film transistor on the red-sub-pixel anode, a red-sub-pixel Hole Injection Layer on the red-sub-pixel thin film transistor, a red-sub-pixel Hole Transporting Layer on the red-sub-pixel Hole Injection Layer, a red light emitting layer on the red-sub-pixel Hole Transporting Layer, a red-sub-pixel Electron Transport Layer on the red light emitting layer and a red-sub-pixel cathode on the red-sub-pixel Electron Transport Layer; the green sub pixel comprises: a green-sub-pixel anode on the substrate, a green-sub-pixel thin film transistor on the green-sub-pixel anode, a green-sub-pixel Hole Injection Layer on the green-sub-pixel thin film transistor, a green-sub-pixel Hole Transporting Layer on the green-sub-pixel Hole Injection Layer, a green light emitting layer on the green-sub-pixel Hole Transporting Layer, a green-sub-pixel Electron Transport Layer on the green light emitting layer and a green-sub-pixel cathode on the green-sub-pixel Electron Transport Layer; the blue sub pixel comprises: a blue-sub-pixel anode on the substrate, a blue-sub-pixel thin film transistor on the blue-sub-pixel anode, a blue-sub-pixel Hole Injection Layer on the blue-sub-pixel thin film transistor, a blue-sub-pixel Hole Transporting Layer on the blue-sub-pixel Hole Injection Layer, a blue light emitting layer on the blue-sub-pixel Hole Transporting Layer, a blue-sub-pixel Electron Transport Layer on the blue light emitting layer and a blue-sub-pixel cathode on the blue-sub-pixel Electron Transport Layer; a material of the red-sub-pixel, green-sub-pixel, and blue-sub-pixel Electron Transport Layers is 8-Hydroxyquinoline aluminum, and a material of the red-sub-pixel, green-sub-pixel, and blue-sub-pixel Hole Transporting layers is polytriphenylamine, and a material of the red-sub-pixel, green-sub-pixel, and blue-sub-pixel Hole Injection Layer is PEDOT;

wherein the red light emitting layer and the green light emitting layer are manufacture by vacuum evaporation and formed after the blue light emitting layer is formed.

* * * * *